United States Patent
Sato et al.

(10) Patent No.: US 8,395,263 B2
(45) Date of Patent: Mar. 12, 2013

(54) SEMICONDUCTOR LIGHT EMITTING DEVICE AND METHOD FOR MANUFACTURING THE SAME

(75) Inventors: Taisuke Sato, Kanagawa-ken (JP); Toshiyuki Oka, Kanagawa-ken (JP); Koichi Tachibana, Kanagawa-ken (JP); Shinya Nunoue, Chiba-ken (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 217 days.

(21) Appl. No.: 13/029,462

(22) Filed: Feb. 17, 2011

(65) Prior Publication Data

US 2012/0032213 A1    Feb. 9, 2012

(30) Foreign Application Priority Data

Aug. 9, 2010    (JP) .................................. 2010-178405

(51) Int. Cl.
    *H01L 23/48*    (2006.01)
(52) U.S. Cl. .................. 257/745; 257/98; 257/E33.025; 257/E33.028; 257/E33.033; 257/E33.034; 257/E33.023; 438/604; 438/605; 438/608; 438/609
(58) Field of Classification Search .................. None
    See application file for complete search history.

(56) References Cited

U.S. PATENT DOCUMENTS

| 6,577,006 B1 | 6/2003 | Oota et al. |
| 2004/0266044 A1 | 12/2004 | Park et al. |
| 2005/0040427 A1 * | 2/2005 | Sugawara et al. ............. 257/103 |
| 2008/0185606 A1 | 8/2008 | Sano et al. |
| 2011/0233596 A1 | 9/2011 | Sano et al. |

FOREIGN PATENT DOCUMENTS

| EP | 1 953 838 A2 | 8/2008 |
| JP | 2001-345480 | 12/2001 |
| JP | 3342336 | 8/2002 |
| JP | 2004-349301 | 12/2004 |
| JP | 2005-197289 | 7/2005 |
| JP | 2006-66903 | 3/2006 |
| JP | 2006-303542 | 11/2006 |
| JP | 2008-135554 A | 6/2008 |

(Continued)

OTHER PUBLICATIONS

U.S. Appl. No. 12/875,632, filed Sep. 3, 2010, Shigeya Kimura et al.

(Continued)

*Primary Examiner* — Fei Fei Yeung Lopez
(74) *Attorney, Agent, or Firm* — Oblon, Spivak, McClelland, Maier & Neustadt, L.L.P.

(57) ABSTRACT

According to one embodiment, a semiconductor light emitting device includes a stacked structural body, a first, a second and a third conductive layer. The stacked structural body includes first and second semiconductors and a light emitting layer provided therebetween. The second semiconductor layer is disposed between the first conductive layer and the light emitting layer. The first conductive layer is transparent. The first conductive layer has a first major surface on a side opposite to the second semiconductor layer. The second conductive layer is in contact with the first major surface. The third conductive layer is in contact with the first major surface and has a reflectance higher than a reflectance of the second conductive layer. The third conductive layer includes an extending part extending in parallel to the first major surface. At least a portion of the extending part is not covered by the second conductive layer.

19 Claims, 6 Drawing Sheets

FOREIGN PATENT DOCUMENTS

| | | |
|---|---|---|
| JP | 2008-182050 | 8/2008 |
| WO | WO 2009/102032 A1 | 8/2009 |
| WO | WO 2010/095192 A1 | 8/2010 |

OTHER PUBLICATIONS

Japanese Office Action issued Jul. 20, 2012 in Patent Application No. 2010-178405 with English Translation.

Extended European Search Report issued Jul. 4, 2012 in Patent Application No. 11157652.6.

U.S. Appl. No. 13/032,943, filed Feb. 23, 2011, Kimura, et al.

Japanese Office Action issued Aug. 26, 2011, in Patent Application No. 2010-178405 (with English-language translation).

U.S. Appl. No. 13/195,926, filed Aug. 2, 2011, Muramoto, et al.

\* cited by examiner

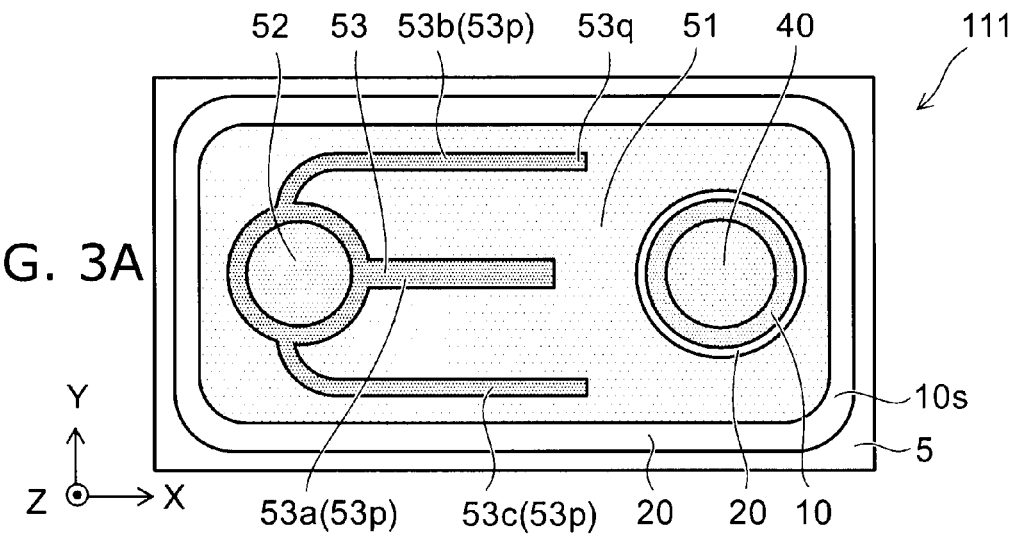
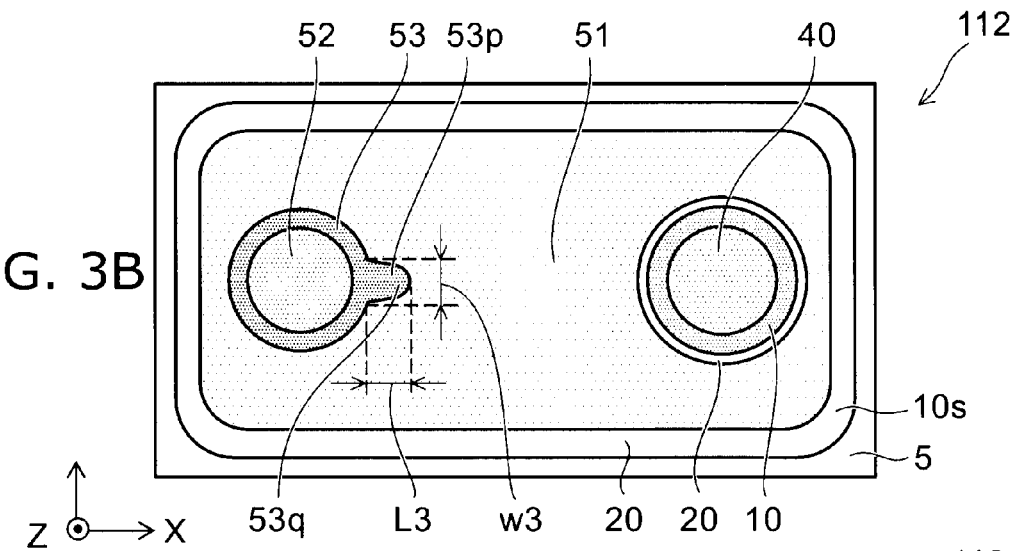
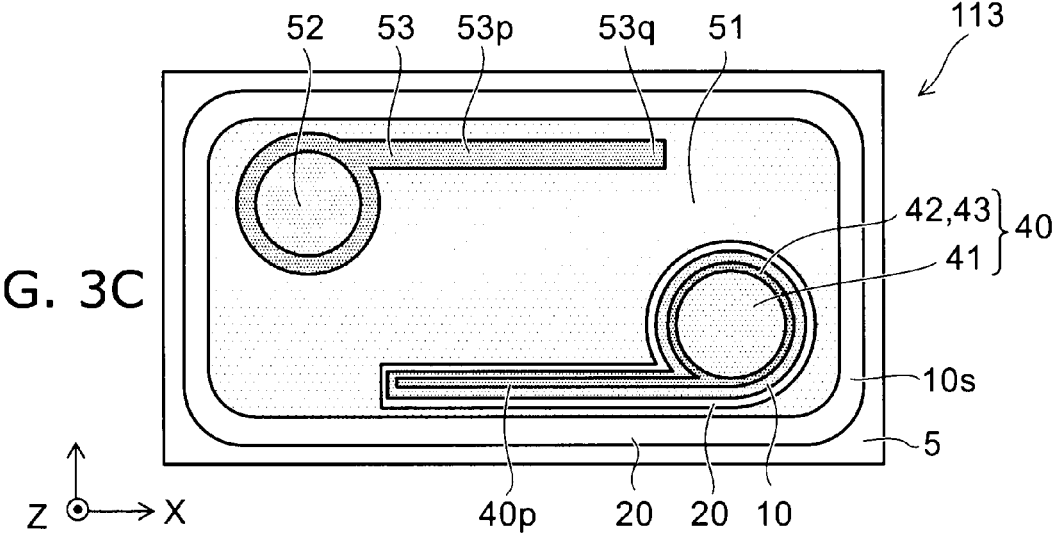

SEMICONDUCTOR LIGHT EMITTING DEVICE AND METHOD FOR MANUFACTURING THE SAME

CROSS-REFERENCE TO RELATED APPLICATIONS

This application is based upon and claims the benefit of priority from the prior Japanese Patent Application No. 2010-178405, filed on Aug. 9, 2010; the entire contents of which are incorporated herein by reference.

FIELD

Embodiments described herein relate generally to a semiconductor light emitting device and a method for manufacturing the same.

BACKGROUND

Nitride semiconductors such as gallium nitride (GaN) semiconductors are used in ultraviolet, blue, and green Light Emitting Diodes (LED); violet and blue Laser Diodes (LD); and the like due to their characteristic wide band gap.

A configuration exists for a semiconductor light emitting device wherein an electrode provided on a transparent electrode includes a base electrode and an auxiliary electrode extending from the base electrode. The base electrode can, for example, be used as a bonding pad electrode. The auxiliary electrode has, for example, a function of distributing the current uniformly.

High bondability and high efficiency are desired of semiconductor light emitting devices.

BRIEF DESCRIPTION OF THE DRAWINGS

FIGS. 3A to 3C are schematic plan views showing other semiconductor light emitting devices according to the embodiment;

DETAILED DESCRIPTION

Figure 1A:
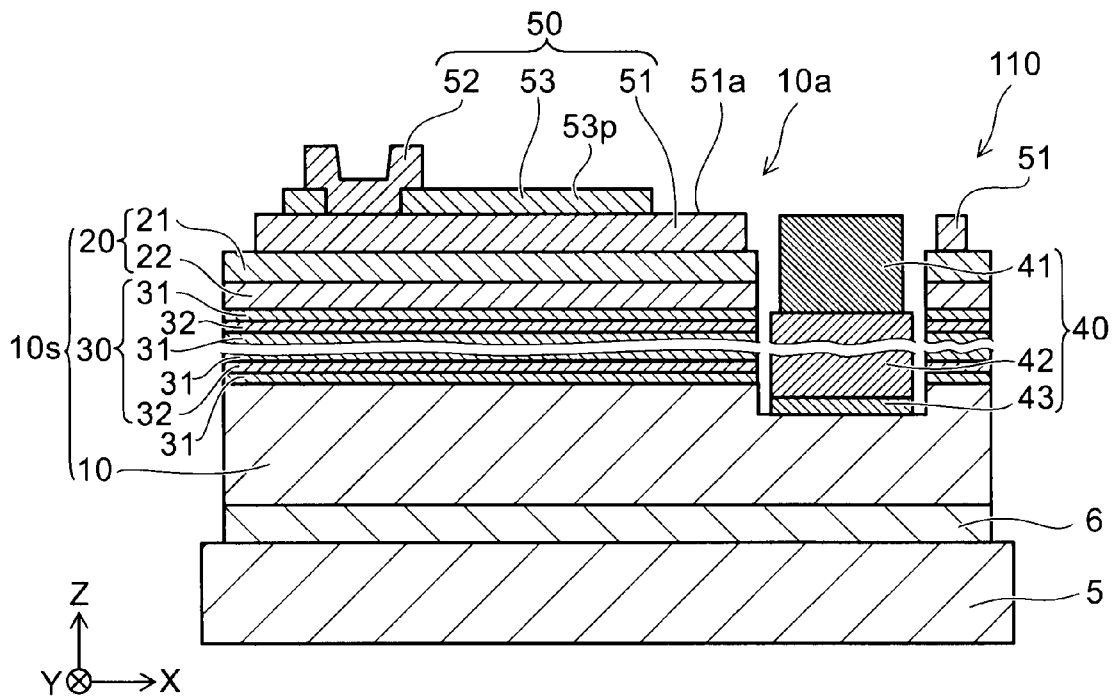
FIGS. 1A and 1B are schematic views showing a semiconductor light emitting device according to an embodiment.

In general, according to one embodiment, a semiconductor light emitting device includes a stacked structural body, a first conductive layer, a second conductive layer, and a third conductive layer. The stacked structural body includes a first semiconductor layer of a first conductivity type including a nitride semiconductor, a second semiconductor layer of a second conductivity type including a nitride semiconductor, and a light emitting layer including a nitride semiconductor provided between the first semiconductor layer and the second semiconductor layer. The second semiconductor layer is disposed between the first conductive layer and the light emitting layer. The first conductive layer is transparent with respect to luminescent light emitted from the light emitting layer. The first conductive layer has a first major surface on a side opposite to the second semiconductor layer. The second conductive layer is in contact with the first major surface and covers a portion of the first major surface. The third conductive layer is in contact with the first major surface and has a reflectance higher than a reflectance of the second conductive layer with respect to the luminescent light. The third conductive layer includes an extending part extending in parallel to the first major surface. At least a portion of the extending part is not covered by the second conductive layer.

Embodiments are described hereinafter while referring to the drawings.

Note that the drawings are schematic or simplified illustrations and that relationships between thicknesses and widths of parts and proportions in size between parts may differ from actual parts. Also, even where identical parts are depicted, mutual dimensions and proportions may be illustrated differently depending on the drawing.

Note that in the drawings and specification of this application, the same numerals are applied to elements that have already appeared in the drawings and been described, and repetitious detailed descriptions of such elements are omitted.

First Embodiment

Figure 1B:
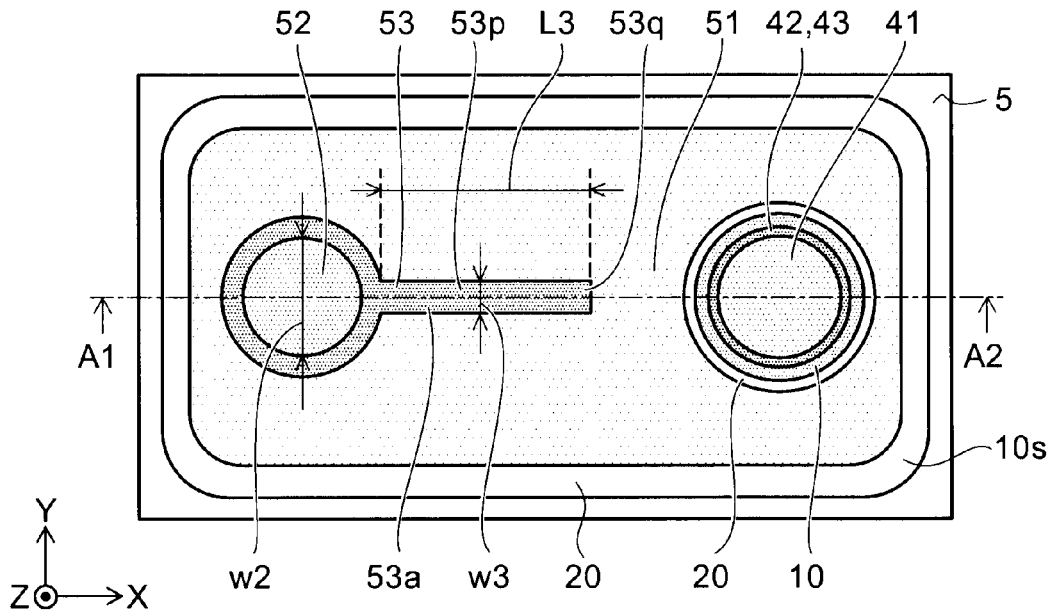

FIG. 1A and FIG. 1B are schematic views illustrating the configuration of a semiconductor light emitting device according to a first embodiment.

Specifically, FIG. 1B is a schematic plan view and FIG. 1A is a cross-sectional view taken across line A1-A2 of FIG. 1B.

As illustrated in FIGS. 1A and 1B, a semiconductor light emitting device 110 according to this embodiment includes a stacked structural body 10s, a first conductive layer 51, a second conductive layer 52, and a third conductive layer 53.

The stacked structural body 10s includes a first semiconductor layer 10 of a first conductivity type including a nitride semiconductor, a second semiconductor layer 20 of a second conductivity type including a nitride semiconductor, and a light emitting layer 30 provided between the first semiconductor layer 10 and the second semiconductor layer 20 and includes a nitride semiconductor layer.

For example, the first semiconductor layer 10 is n-type and the second semiconductor layer 20 is p-type. However, the embodiment is not limited to this and the first semiconductor layer 10 may be p-type and the second semiconductor layer 20 may be n-type. Hereafter, a case in which the first semiconductor layer 10 is n-type, and the second semiconductor layer 20 is p-type will be described.

In the stacked structural body 10s of the semiconductor light emitting device 110, the first semiconductor layer 10, the light emitting layer 30, and the second semiconductor layer 20 are stacked. A direction from the first semiconductor layer 10 toward the second semiconductor layer 20 is defined as a "Z-axis direction" (first direction).

Here, in this specification, the term "stacked" includes cases where constituents are stacked so that they are in contact with each other and also cases where constituents are stacked by inserting other layers therebetween.

The light emitting layer 30 includes a plurality of barrier layers 31, and a well layer 32 provided between the plurality of barrier layers 31. For example, the light emitting layer 30 can have a single quantum well (SQW) structure including two of the barrier layers 31 and the well layer 32 provided between the barrier layers 31. For example, the light emitting layer 30 can have a multi quantum well (MQW) structure including three or more of the barrier layers 31 and the well layer 32 provided between each of the barrier layers 31.

In other words, the light emitting layer 30 includes, for example, (n+1) barrier layers 31 and n well layers 32 ("n" is an integer greater than or equal to 1). An ith barrier layer BLi is provided between the first semiconductor layer 10 and an ith well layer WLi ("i" is an integer less than or equal to n). The ith well layer WLi is provided between an ith barrier layer BL(i) and an (i+1)th barrier layer BL(i+1). The (n+1)th barrier layer is provided between an nth well layer WLn and the second semiconductor layer 20.

The well layer 32 includes, for example, a nitride semiconductor containing indium (In) and gallium (Ga). A band gap energy of the barrier layers 31 is larger than a band gap energy of the well layer 32. The barrier layers 31 may or may not include indium. If the barrier layers 31 include indium, a composition ratio of indium among the group III elements of the barrier layers 31 is lower than a composition ratio of indium among the group III elements of the well layer 32.

Examples of the barrier layers 31 include $In_{0.02}Ga_{0.98}N$ layers. A thickness of the barrier layers 31 is, for example, 12.5 nanometers (nm). Examples of the well layer 32 include undoped $In_{0.2}Ga_{0.8}N$ layers. A thickness of the well layer 32 is, for example, 2.5 nm. The light emitting layer 30 of this example is designed so that a photoluminescence wavelength of the light emitting layer 30 at ambient temperature is 450 nm.

An n-type GaN layer doped with n-type impurities may be used, for example, as the first semiconductor layer 10. At least one of Si, Ge, and Sn is used as the n-type impurities. In this example, Si is used as the n-type impurities. A concentration of Si (amount doped) in the first semiconductor layer 10 is, for example, approximately $2 \times 10^{18}$ cm$^{-3}$.

The second semiconductor layer 20 includes, for example, a first p-type semiconductor layer 21, and a second p-type semiconductor layer 22 provided between the first p-type semiconductor layer 21 and the light emitting layer 30. A p-type GaN layer may be used, for example, as the second p-type semiconductor layer 22. A thickness of the second p-type semiconductor layer 22 is, for example, roughly about 90 nm. At least one of Mg and Zn may be used as the p-type impurities. In this example, Mg is used as the p-type impurities. A concentration of Mg in the second p-type semiconductor layer 22 is, for example, $4 \times 10^{18}$ cm$^{-3}$. A p-type GaN layer may be used, for example, as the first p-type semiconductor layer 21. The first p-type semiconductor layer 21 functions as a contact layer. A thickness of the first p-type semiconductor layer 21 is, for example, about 10 nm. A concentration of Mg in the first p-type semiconductor layer 21 is, for example, about $1 \times 10^{20}$ cm$^{-3}$.

A portion of the first semiconductor layer 10 and a portion of the light emitting layer 30 corresponding therewith, and a portion of the second semiconductor layer 20 are removed from a second major surface 10a on the second semiconductor layer 20 side of the stacked structural body 10s including the first semiconductor layer 10, the light emitting layer 30, and the second semiconductor layer 20. The first semiconductor layer 10 is exposed on the second major surface 10a side of the second semiconductor layer 20 side of the stacked structural body 10s.

A first electrode 40 that is in contact with the first semiconductor layer 10 is provided on the second major surface 10a side of the second semiconductor layer 20 side of the stacked structural body 10s.

In this example, the first electrode 40 includes a first n-side conductive film 41, a second n-side conductive film 42 provided between the first n-side conductive film 41 and the first semiconductor layer 10, and a third n-side conductive film 43 provided between the second n-side conductive film 42 and the first semiconductor layer 10. A gold film (Au film) may be used, for example, as the first n-side conductive film 41. A thickness of the first n-side conductive film 41 is, for example, about 0.2 micrometers (μm). A platinum film (Pt film) may be used, for example, as the second n-side conductive film 42. A thickness of the second n-side conductive film 42 is, for example, about 0.05 μm. A titanium film (Ti film) may be used, for example, as the third n-side conductive film 43. A thickness of the third n-side conductive film 43 is, for example, about 0.05 μm. The first n-side conductive film 41 may become, for example, a pad part in the first electrode 40.

Meanwhile, a second electrode 50 that is in contact with the second semiconductor layer 20 is provided on the second major surface 10a side of the second semiconductor layer 20 side of the stacked structural body 10s. The first conductive layer 51, the second conductive layer 52, and the third conductive layer 53, are included in the second electrode 50.

The first conductive layer 51 is provided on a side of the second semiconductor layer 20 that is opposite the first semiconductor layer 10. The first conductive layer 51 is transparent with respect to luminescent light emitted from the light emitting layer 30. The first conductive layer 51 includes an oxide having at least one element selected from the group consisting of In, Sn, Zn, and Ti. Indium Tin Oxide (ITO) may be used, for example, as the first conductive layer 51.

The second semiconductor layer 20 is disposed between the first conductive layer 51 and the light emitting layer 30. The first conductive layer 51 has a first major surface 51a on a side opposite to the second semiconductor layer 20.

The second conductive layer 52 is in contact with the first major surface 51a of the first conductive layer 51, on a side opposite the second semiconductor layer 20. The second conductive layer 52 covers a portion of the first major surface 51a. The second conductive layer 52 may become, for example, a bonding pad part of the second electrode 50. The second conductive layer 52 is in electrical contact with the first conductive layer 51.

The third conductive layer 53 is in contact with the first major surface 51a described above of the first conductive layer 51. The third conductive layer 53 has a reflectance higher than a reflectance of the second conductive layer 52 with respect to the luminescent light. The third conductive layer 53 includes an extending part 53p. At least a portion of the extending part 53p is not covered by the second conductive layer 52. The extending part 53p extends in parallel to the first major surface 51a. In other words, the extending part 53p extends in a direction perpendicular to the Z-axis direction.

In this example, the extending part 53p of the third conductive layer 53 extends in a direction from the second conductive layer 52 toward the first electrode 40. The extending part 53p has an elongated shape. The third conductive layer 53 has a function of spreading the current.

In the example illustrated in FIG. 1A and FIG. 1B, the second conductive layer 52 is covering a portion of the third conductive layer 53. Embodiments are not limited thereto and a portion of the second conductive layer 52 may contact a portion of the third conductive layer 53. Additionally, the third conductive layer 53 may cover a portion of the second conductive layer 52.

Adhesion of the second conductive layer 52 to the first conductive layer 51 is greater than adhesion of the third conductive layer 53 to the first conductive layer 51. In other words, by setting the adhesion of the second conductive layer 52 that functions as the bonding pad part to be high, high bondability in the bonding pad part can be ensured.

On the other hand, high adhesion is not necessarily needed in the third conductive layer 53, which has the function of making the current uniform. Therefore, the demand for adhesion of the third conductive layer 53 to the first conductive layer 51 is reduced. Thus, materials that have a higher reflectance than materials used for the second conductive layer 52 can be used for the third conductive layer 53. By using such a third conductive layer 53, the current is made to be uniform, a high luminous efficiency can be obtained, and, at the same time, high light extraction efficiency due to high reflectance can be obtained. In other words, high efficiency can be obtained.

Thus, high bondability can be obtained due to the second conductive layer 52 and high luminous efficiency and high light extraction efficiency can be obtained due to the third conductive layer 53. In other words, high efficiency can be obtained.

The second conductive layer 52 can include a layer which is in contact with the first conductive layer 51, the layer containing at least one of nickel, titanium, vanadium, platinum, and gold. The layer described above containing at least one of nickel, titanium, vanadium, platinum, and gold can also include an alloy containing at least two of nickel, titanium, vanadium, platinum, and gold. For example, nickel has high adhesion to ITO. Thereby, high adhesion between the second conductive layer 52 and the first conductive layer 51 can be ensured. The reflectance of nickel with respect to blue light is comparatively low at about 40%.

The third conductive layer 53 can include at least one of aluminum, silver, platinum, and rhodium. The third conductive layer 53 can include an alloy containing at least two of aluminum, silver and platinum, and rhodium. For example, the reflectance of aluminum with respect to ultraviolet and blue light is high at 89%. The reflectance of gold with respect to ultraviolet and blue light is even higher at 98%. Thereby, high light extraction efficiency can be obtained by using such a material having a high reflectance as the third conductive layer 53. The adhesion of, for example, aluminum and gold to ITO is less than that of, for example, nickel.

Thus, by using mutually different materials for the second conductive layer 52 and the third conductive layer 53, the performance demands made of the second conductive layer 52 and the third conductive layer 53, respectively, will be sufficiently satisfied.

According to the semiconductor light emitting device 110 according to this embodiment, a semiconductor light emitting device having high bondability and high efficiency can be provided.

With a positive pole including a transparent electrode formed on a semiconductor layer and a bonding pad electrode formed on the transparent electrode, a configuration is known that has a reflective layer on a surface where the bonding pad electrode contacts the transparent electrode. Thereby, suppressing light absorption of the bonding pad part has been suggested. However, in this configuration, the reflective layer described above is a part of the bonding pad electrode. Therefore, a shape of the reflective layer when viewed from the Z-axis direction is congruent with a shape of the bonding pad electrode when viewed in the Z-axis direction. In other words, the reflective layer does not have a part extending from the bonding pad electrode along a major surface of the transparent electrode. Therefore, in this configuration, the current cannot be made uniform.

In contrast, in the semiconductor light emitting device 110 according to this embodiment, the third conductive layer 53 having high reflectance has the extending part 53p extending along the first major surface 51a of the first conductive layer 51. Due to this extending part 53p, the current flowing between the second conductive layer 52 and the first electrode 40 can be made uniform and luminous efficiency can be improved.

In other words, according to this embodiment, light absorption can be suppressed and high bondability can be ensured while improving luminous efficiency due to the making the current uniform.

In a configuration in which the electrodes provided on the transparent electrode include a base electrode and an auxiliary electrode extending from the base electrode, if, for example, the same material is used for the base electrode and the auxiliary electrode, then bondability will be poor and/or light absorption efficiency will be significantly lost.

For example, if the second conductive layer 52 has the same pattern configuration as the extending part 53p, processability of the second conductive layer 52 will be troublesome when narrowing the extending part 53p in order to improve light extraction efficiency. Additionally, if the second conductive layer 52 has a pattern configuration having a large width that covers an entirety of the extending part 53p, the second conductive layer 52 that has low reflectance will oppose the light emitting layer 30. Therefore, light absorption will increase and light extraction efficiency will decrease.

In contrast, in the semiconductor light emitting device 110 according to this embodiment, the pattern configuration of the second conductive layer 52 and the pattern configuration of the extending part 53p of the third conductive layer 53 are mutually different. Specifically, the second conductive layer 52 that functions as the bonding pad part has a pattern configuration that makes possible the manifestation of properties appropriate for a bonding pad part. For example, the second conductive layer 52 has a pattern configuration that is roughly circular, roughly flat circular, roughly rectangular, roughly polygonal, or the like. On the other hand, the third conductive layer 53 has a pattern configuration that is, for example, a linear shape so that a high light extraction efficiency can be obtained while making the current uniform. Moreover, materials having appropriate properties are used for each of the second conductive layer 52 and the third conductive layer 53 that have mutually different shapes. Specifically, a material with excellent bondability to the first conductive layer 51 is used for the second conductive layer 52. A material with high reflectance is used for the third conductive layer 53. Thus, a semiconductor light emitting device having high bondability and high efficiency can be provided.

In this embodiment, a thickness of the first conductive layer 51 is described as being, for example, from 50 nm to 300 nm. If the thickness of the first conductive layer 51 is less than 50 nm, a sheet resistance of the first conductive layer 51 will be too high, the current will be difficult to spread, and efficiency will easily decrease. If the thickness of the first conductive layer 51 exceeds 300 nm, light extraction characteristics will easily deteriorate. The thickness of the first conductive layer 51 is more preferably from 100 nm to 250 nm.

As illustrated in FIG. 1A, the semiconductor light emitting device 110 may further include a substrate 5 that is provided on a side of the first semiconductor layer 10 opposite to the second semiconductor layer 20. At least one of sapphire, GaN, SiC, Si, and GaAs can be used for the substrate 5. In this example, sapphire is used for the substrate 5. The semiconductor light emitting device 110 may further include a buffer layer 6, provided between the substrate 5 and the first semiconductor layer 10. The buffer layer 6 is formed on the substrate 5, and the stacked structural body 10s including the first semiconductor layer 10, the light emitting layer 30, and the second semiconductor layer 20 is formed on the buffer layer 6. After the stacked structural body 10s is formed, the substrate 5 and (at least a part of) the buffer layer 6 may be removed. In other words, in the semiconductor light emitting device 110, the substrate 5 and the buffer layer 6 can be provided or omitted as necessary.

A multilayered structural body (not shown) may be further provided between the first semiconductor layer 10 and the light emitting layer 30. The multilayered structural body includes a plurality of first layers (not shown) that are stacked in the Z-axis direction and a second layer that is provided between each of the first layers. In other words, the multilayered structural body includes a plurality of first layers and a plurality of second layers that are alternately stacked in the Z-axis direction. The multilayered structural body may be, for example, a superlattice layer. The multilayered structural body may be provided or omitted as necessary. The multilayered structural body may also be considered to be included in the first semiconductor layer 10.

Additionally, as described hereinafter, an insulating film (not shown in FIGS. 1A and 1B) that covers the stacked structural body 10s except for a portion of the first electrode 40 and a portion of the second conductive layer 52 may be further provided. This insulating film may cover the first conductive layer 51 and the second conductive layer 52.

Here, a direction from the second conductive layer 52 toward the first electrode 40 is defined as an "X-axis direction" (second direction). A direction perpendicular to the Z-axis direction and perpendicular to the X-axis direction is defined as a "Y-axis direction" (third direction).

Hereinafter, an example of a manufacturing method of the semiconductor light emitting device 110 will be described.

FIG. 2A to FIG. 2E are sequential schematic cross-sectional views illustrating a manufacturing method of the semiconductor light emitting device according to the first embodiment.

Figure 2A:
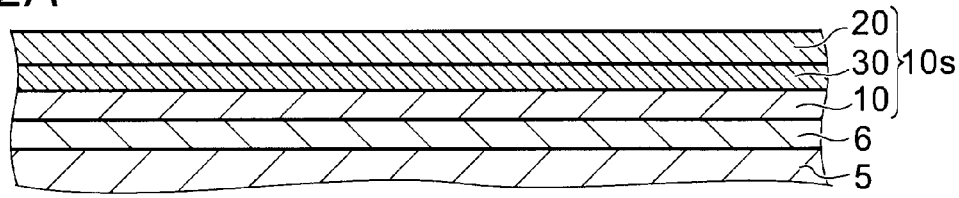
FIGS. 2A to 2E are sequential schematic cross-sectional views showing a manufacturing method of a semiconductor light emitting device according to the embodiment.

As illustrated in FIG. 2A, for example, after forming the buffer layer 6 on a major surface of the substrate 5 that is made from sapphire, a crystal of an n-type GaN layer doped with n-type impurities is grown as the first semiconductor layer 10.

For example, metal organic chemical vapor deposition (MOCVD) is used to grow the crystal. Molecular beam epitaxy (MBE) may also be used to grow the crystal.

A crystal of the light emitting layer 30 is grown on the first semiconductor layer 10. For example, a barrier layer 31 is formed. The well layers 32 and the barrier layers 31 are grown alternately thereon. The barrier layer 31 is grown on the well layer 32 that is formed last. Thus, a light emitting layer 30 having a MQW structure is formed. A growth temperature of the barrier layers 31 and the well layers 32 is, for example, from 700° C. to 800° C.

A crystal of the second semiconductor layer 20 is grown on the light emitting layer 30. A crystal of a p-type GaN layer that will become the second p-type semiconductor layer 22 is grown, and a crystal of a p-type GaN layer that will become the first p-type semiconductor layer 21 is grown thereon. A growth temperature of these p-type GaN layers is, for example, from 1000° C. to 1100° C.

Thus, the stacked structural body 10s illustrated in FIG. 2A is formed.

Figure 2B:
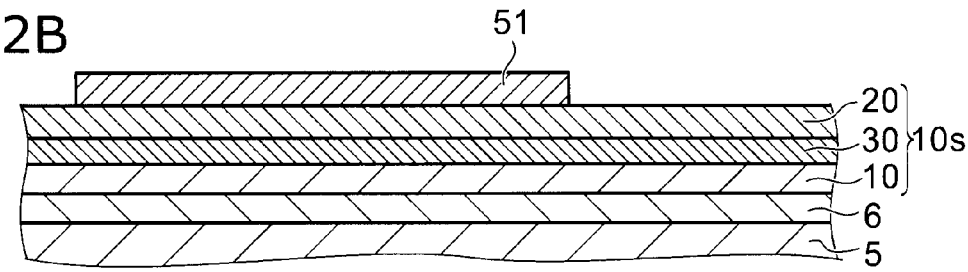

As illustrated in FIG. 2B, the first conductive layer 51 is formed on the second semiconductor layer 20 (specifically, on the first p-type semiconductor layer 21). Specifically, the first conductive layer 51 is obtained by forming an ITO film that will become the first conductive layer 51 on the second semiconductor layer 20, and processing the ITO film into a predetermined shape. In this example, the thickness of the first conductive layer 51 is 170 nm.

Figure 2C:
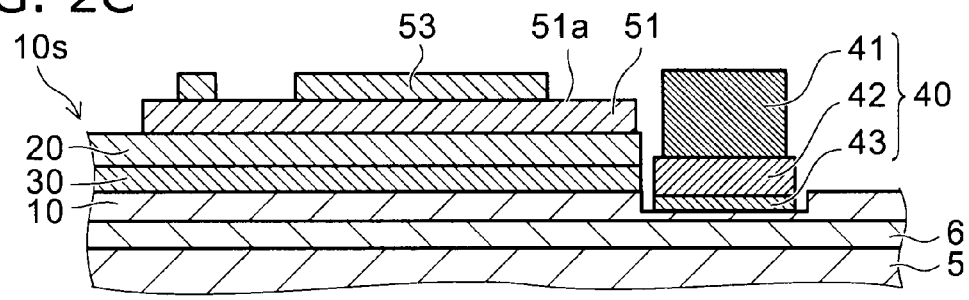

As illustrated in FIG. 2C, the stacked structural body 10s is processed by, for example, dry etching, and the first semiconductor layer 10 (for example, the n-type GaN layer) is exposed. The first electrode 40 is formed on the exposed first semiconductor layer 10. Specifically, a Ti film that will become the third n-side conductive film 43 is formed on the first semiconductor layer 10, a Pt film that will become the second n-side conductive film 42 is formed thereon, and an Au film that will become the first n-side conductive film 41 is formed thereon.

An Al film is formed on the first major surface 51a of the first conductive layer 51 as the third conductive layer 53. A thickness of the Al film is, for example, about 0.5 μm. The third conductive layer 53 is obtained by processing the Al film into a predetermined shape. At this point, a portion of the first conductive layer 51 is exposed.

Figure 2D:
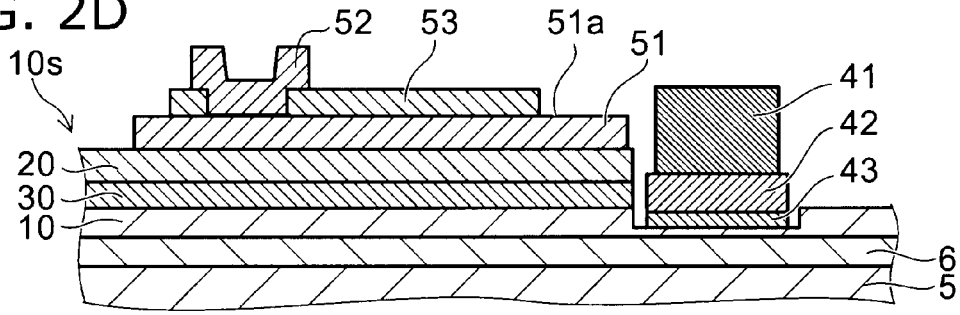

As illustrated in FIG. 2D, the second conductive layer 52 is formed on the exposed first conductive layer 51. Specifically, a Ni film that will become the second conductive layer 52 is formed. Furthermore, an Au film may be formed on the Ni film. The second conductive layer 52 is obtained by processing this/these Ni (and Au) film(s) into a predetermined shape(s).

Figure 2E:
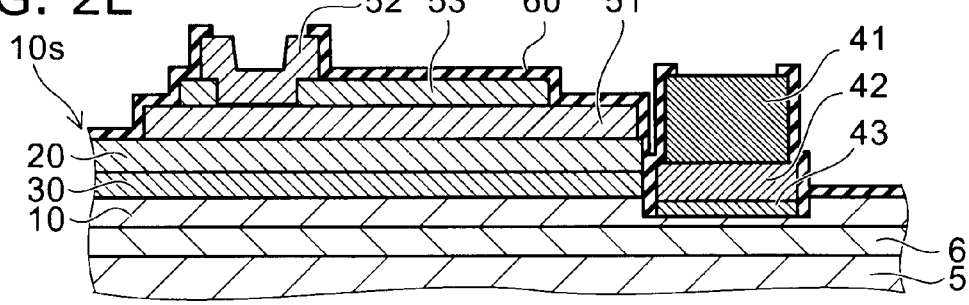

As illustrated in FIG. 2E, an insulating film 60 is formed, for example, by forming a SiO$_2$ film on an entire surface of the processed film, and processing the SiO$_2$ film. The insulating film 60 covers the stacked structural body 10s except for a portion of the first electrode 40 and a portion of the second conductive layer 52. The insulating film 60 covers the first conductive layer 51 and the second conductive layer 52. The insulating film 60 functions as a passivation film.

Thus, the semiconductor light emitting device 110 according to this embodiment is obtained.

In the semiconductor light emitting device 110, an Al film that has high reflectance with respect to blue light is used as the third conductive layer 53. An Au film that has high reflectance with respect to blue light may also be used as the third conductive layer 53. However, adhesion of the third conductive layer 53 to the first conductive layer 51 is less than adhesion of the second conductive layer 52 to the first conductive layer 51. On the other hand, a Ni film that has strong adhesion is used as the second conductive layer 52 that will become the bonding pad part.

Thus, in the semiconductor light emitting device 110, the second conductive layer 52 that has high bonding strength and the third conductive layer 53 that has high reflectance are formed respectively from different materials on the transparent first conductive layer 51. Thereby, high bonding strength can be ensured in the second conductive layer 52 that will become the bonding pad part, and high light extraction efficiency is obtained for the third conductive layer 53 that has the functions of diffusing the current and efficiently supplying the current to the light emitting layer 30.

By forming the second conductive layer 52 that will become the bonding pad part on the first conductive layer 51 from a material different from the material of the third conductive layer 53, peeling off of the electrode pads during wire bonding can be suppressed.

As illustrated in FIG. 1B, the extending part 53p of the third conductive layer 53 has a portion (proximal portion 53q) that has a distance from the first electrode 40 (particularly the pad part of the first electrode 40) that is less than a distance from the second conductive layer 52 to the first electrode 40 (particularly, the pad part of the first electrode 40). The proximal portion 53q may be, for example, an end of the extending part 53p. The distance from the proximal portion 53q to the first electrode 40 (particularly the pad part of the first electrode 40) is greater than the distance from the second conductive layer 52 to the first electrode 40 (particularly the pad part of the first electrode 40). Thus, the current flowing between the second electrode 50 and the first electrode 40 can be made uniform and therefore, luminous efficiency can be improved.

In the semiconductor light emitting device 110, the extending part 53p extends in the X-axis direction. Specifically, the extending part 53p is perpendicular to the Z-axis direction, and includes a portion (first portion 53a) that extends in the X-axis direction from the second conductive layer 52 toward the first electrode 40.

A width of the extending part 53p that serves to make the current uniform is less than the width of the second conductive layer 52 that will become the bonding pad part.

Specifically, as illustrated in FIG. 1B, a width w3 of the extending part 53p in a direction that is perpendicular to the extending direction of the extending part 53p and parallel to the first major surface 51a is less than a width w2 of the second conductive layer 52 in a direction that is parallel to the first major surface 51a. For example, the width w3 of the extending part 53p in the direction that is perpendicular to the extending direction of the extending part 53p and parallel to the first major surface 51a is less than a width w2 of the second conductive layer 52 in a direction that is perpendicular to the extending direction of the extending part 53p and parallel to the first major surface 51a. In other words, the extending part 53p is a thin line. Thus, while reducing area of the light-blocking third conductive layer 53, the current can be made to efficiently flow between the second conductive layer 52 and the first conductive layer 51. Therefore, high luminous efficiency can be obtained while suppressing decreases in light extraction efficiency.

The width w3 of the extending part 53p in the direction that is perpendicular to the extending direction of the extending part 53p and parallel to the first major surface 51a is preferably from 1 μm to 50 μm. If the width w3 is less than 1 μm, for example, processing of the extending part 53p will be difficult and the resistance of the extending part 53p will increase. If the width w3 exceeds 50 μm, the ratio of the luminescent light shielded by the extending part 53p will increase and light extraction efficiency will decrease.

The width w2 of the second conductive layer 52, which is a width in the direction parallel to the first major surface 51a, is preferably from 30 μm to 80 μm. If the width w2 is less than 30 μm, for example, bonding work will be difficult and adhesion to the bonding wire will decline. If the width w2 exceeds 80 μm, the area of the second conductive layer 52 having low reflectance will increase and, therefore, light extraction efficiency will decrease. In this case as well, a relationship is maintained in which the width w3 of the extending part 53p is less than the width w2 of the second conductive layer 52.

A length L3 in the extending direction of the extending part 53p is longer than the width w3 in the direction that is perpendicular to the extending direction of the extending part 53p. In other words, the extending part 53p is a thin line. Thus, the area of the extending part 53p can be reduced and light extraction efficiency can be improved while making the current flowing between the second conductive layer 52 and the first electrode 40 to be uniform.

FIG. 3A to FIG. 3C are schematic plan views illustrating the configurations of other semiconductor light emitting devices according to the first embodiment.

As illustrated in FIG. 3A, in the third conductive layer 53 of a semiconductor light emitting device 111 according to this embodiment, the extending part 53p has three portions (a first portion 53a, a second portion 53b, and a third portion 53c). The first portion 53a extends in the X-axis direction from the second conductive layer 52 toward the first electrode 40. The second portion 53b extends in a positive direction of the Y-axis direction from the second conductive layer 52, and then extends in the X-axis direction toward the first electrode 40. The third portion 53c extends in a negative direction of the Y-axis direction from the second conductive layer 52, and then extends in the X-axis direction toward the first electrode 40. Thus, the extending part 53p can include a plurality of portions.

As illustrated in FIG. 3B, in the third conductive layer 53 of a semiconductor light emitting device 112 according to this embodiment, the length L3 in the extending direction of the extending part 53p is substantially the same as the width w3 of the extending part 53p in the direction that is perpendicular to the extending direction of the extending part 53p. Such a length L3 in the extending direction of the extending part 53p is not limited as long as it is greater than or equal to the width w3 in the direction that is perpendicular to the extending direction of the extending part 53p. In cases where the length L3 of the extending part 53p is relatively short as well, such as in the semiconductor light emitting device 112, the extending part 53p of the third conductive layer 53 has the proximal portion 53q that has the distance from the first electrode 40 that is less than the distance from the second conductive layer 52 to the first electrode 40. In cases where the third conductive layer 53 has such a extending part 53p as well, in comparison with a configuration in which the third conductive layer 53 is not provided and the first conductive layer 51 and the second conductive layer 52 are provided, the current that flows between the second conductive layer 52 and the first electrode 40 can be made uniform. In this case, by using a material for the third conductive layer 53 that has a higher reflectance than the material used for the second conductive layer 52, loss of light at the third conductive layer 53 can be controlled and efficiency can be improved.

As illustrated in FIG. 3C, in a semiconductor light emitting device 113 according to this embodiment, the second conductive layer 52 and the first n-side conductive film 41 (pad part) of the first electrode 40 are provided on the major surface of the stacked structural body 10s at mutually opposing corners. The extending part 53p of the third conductive layer 53 extends along one edge of the stacked structural body 10s. The second n-side conductive film 42 and the third n-side conductive film 43 of the first electrode 40 extend along an edge of the major surface of the stacked structural body 10s from the first n-side conductive film 41. In other words, the second n-side conductive film 42 and the third n-side conductive film 43 have an n-side extending part 40p that extends from the first n-side conductive film 41.

The extending direction of the extending part 53p of the third conductive layer 53 and the extending direction of the n-side extending part 40p are substantially mutually parallel to such a configuration, by providing the extending part 53p and the n-side extending part 40p, the current can be made uniform and luminous efficiency can be improved. Furthermore, by using a material for the third conductive layer 53 that has a higher reflectance than the material used for the second conductive layer 52, high bondability and high efficiency can be obtained.

Figure 4A:
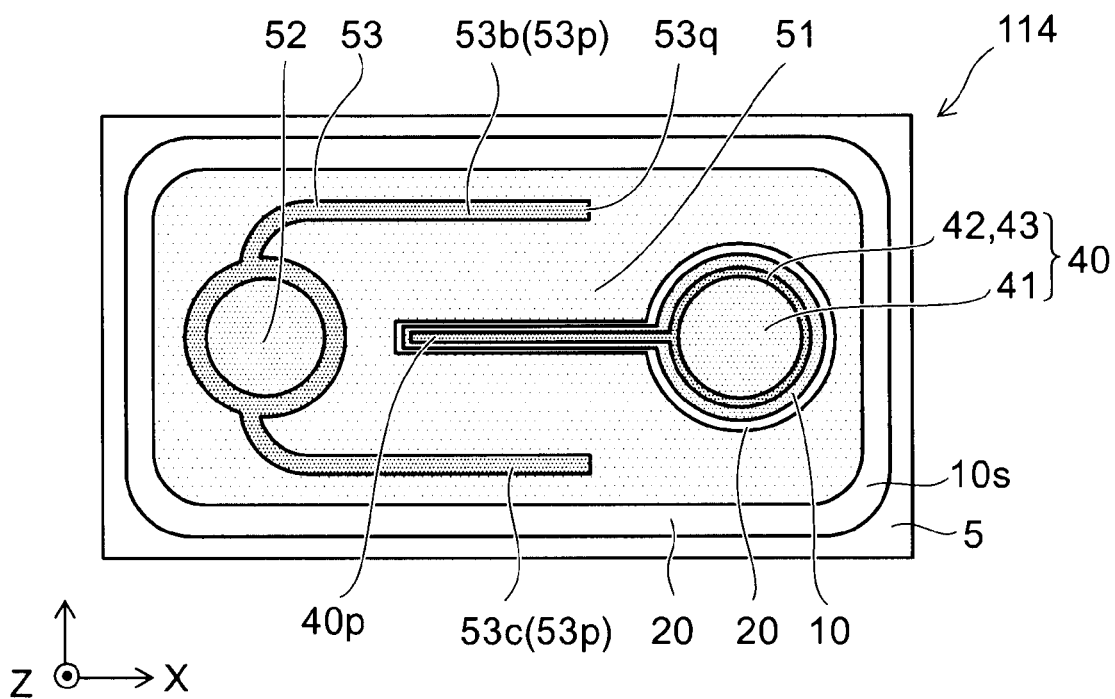
FIG. 4A to FIG. 4B are schematic plan views illustrating other semiconductor light emitting devices according to the embodiment.
Figure 4B:
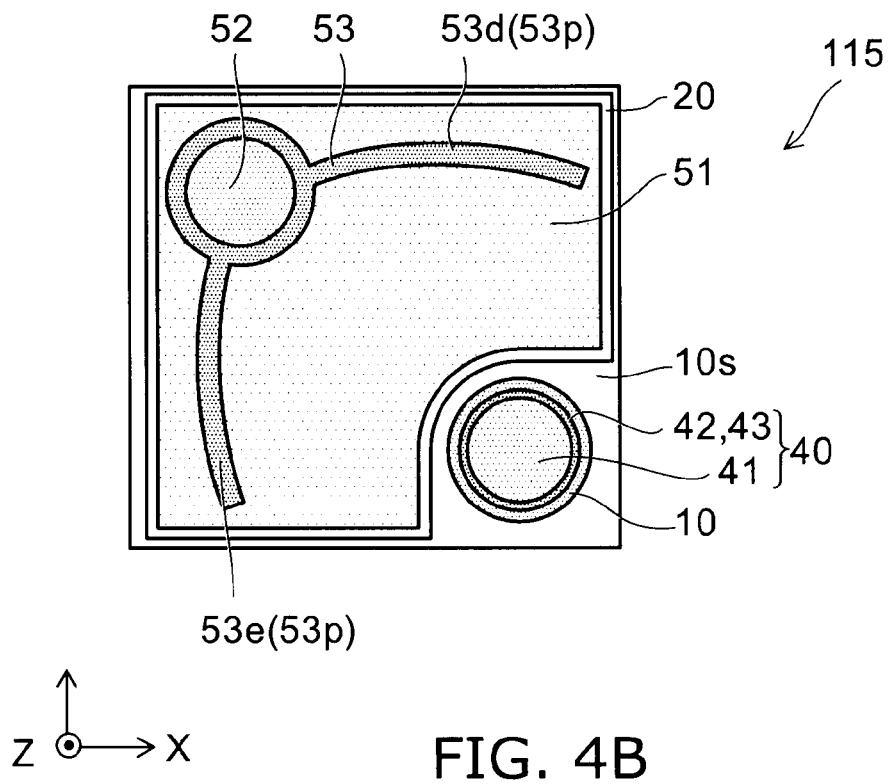

FIG. 4A to FIG. 4B are schematic plan views illustrating the configurations of other semiconductor light emitting devices according to the first embodiment.

As illustrated in FIG. 4A, in the third conductive layer 53 of a semiconductor light emitting device 114 according to this embodiment, the extending part 53p has two portions (the second portion 53b and the third portion 53c). The second portion 53b extends in a positive direction of the Y-axis direction from the second conductive layer 52, and then extends in the X-axis direction toward the first electrode 40. The third portion 53c extends in a negative direction of the Y-axis direction from the second conductive layer 52, and then extends in the X-axis direction toward the first electrode 40.

On the other hand, the second n-side conductive film 42 and the third n-side conductive film 43 of the first electrode 40 have an n-side extending part 40p that extends in the X-axis direction from the first n-side conductive film 41 toward the second conductive layer 52. The n-side extending part 40p is disposed between the two portions (the second portion 53b and the third portion 53c) of the extending part 53p in the Y-axis direction. In such a configuration, by providing the extending part 53p and the n-side extending part 40p, the current can be made uniform and luminous efficiency can be improved. Furthermore, by using a material for the third conductive layer 53 that has a higher reflectance than the material used for the second conductive layer 52, high bondability and high efficiency can be obtained.

As illustrated in FIG. 4B, in a semiconductor light emitting device 115 according to this embodiment, the second conductive layer 52 and the first n-side conductive film 41 of the first electrode 40 are provided on the major surface of the stacked structural body 10s at mutually opposing corners. The extending part 53p of the third conductive layer 53 has two portions (a fourth portion 53d and a fifth portion 53e). These two portions respectively extend from the second conductive layer 52 along two intersecting edges of the stacked structural body 10s. In such a configuration as well, by providing the extending part 53p of the third conductive layer 53, the current can be made uniform and luminous efficiency can be improved. Furthermore, by using a material for the third conductive layer 53 that has a higher reflectance than the material used for the second conductive layer 52, high bondability and high efficiency can be obtained.

Thus, various variations of the semiconductor light emitting device according to this embodiment are possible.

Figure 5:
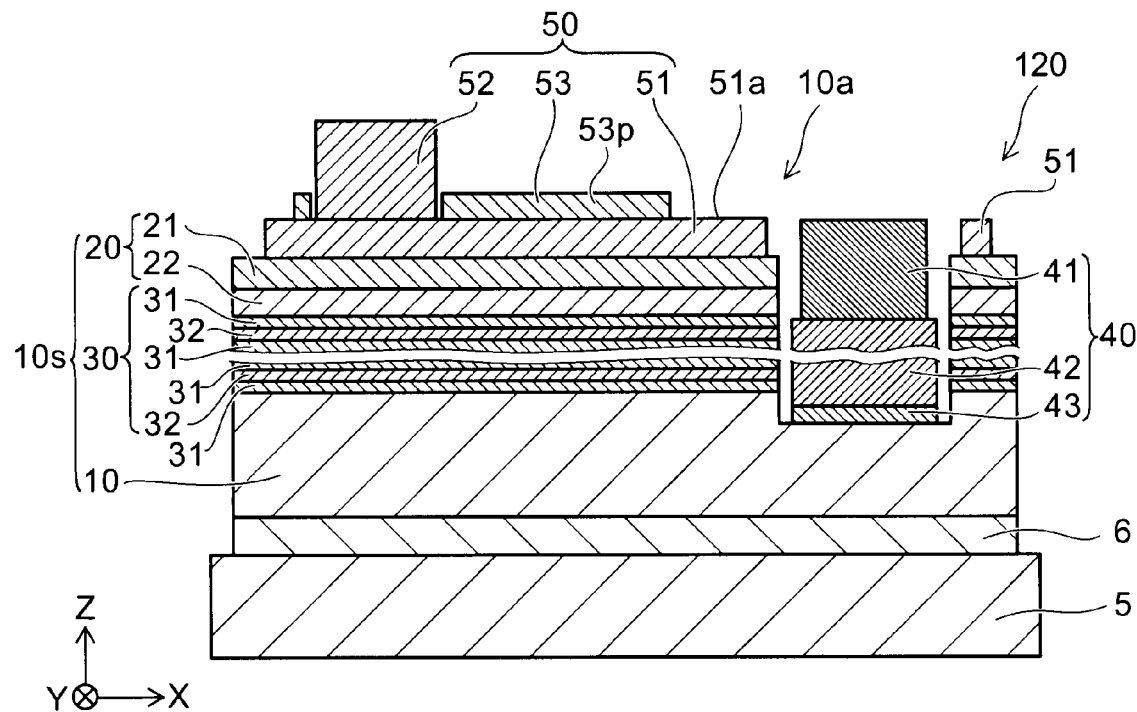
FIG. 5 is a schematic cross-sectional view showing another semiconductor light emitting device according to the embodiment.

FIG. 5 is a schematic cross-sectional view illustrating the configuration of another semiconductor light emitting device according to the first embodiment.

As illustrated in FIG. 5, in a semiconductor light emitting device 120 according to this embodiment, the third conductive layer 53 and the second conductive layer 52 are not in mutual contact. For example, in cases in where the sheet resistance of the first conductive layer 51 is relatively low and a gap between the third conductive layer 53 and the second conductive layer 52 is relatively small, the third conductive layer 53 and the second conductive layer 52 need not be in mutual contact. In other words, it is sufficient that the second conductive layer 52 be in contact with the first conductive layer 51 and that the third conductive layer 53 be in contact with the first conductive layer 51. In this case as well, high bondability and high efficiency can be obtained.

In a semiconductor light emitting device according to this embodiment (i.e. the semiconductor light emitting device 110), an Au film can be used as the first n-side conductive film 41, an Al film can be used as the second n-side conductive film 42, and a Ti film can be used as the third n-side conductive film 43. In this case, an Al film can be used as the third conductive layer 53. The Al film of the second n-side conductive film 42 and the Al film of the third conductive layer 53 can be formed simultaneously.

Figure 6A:
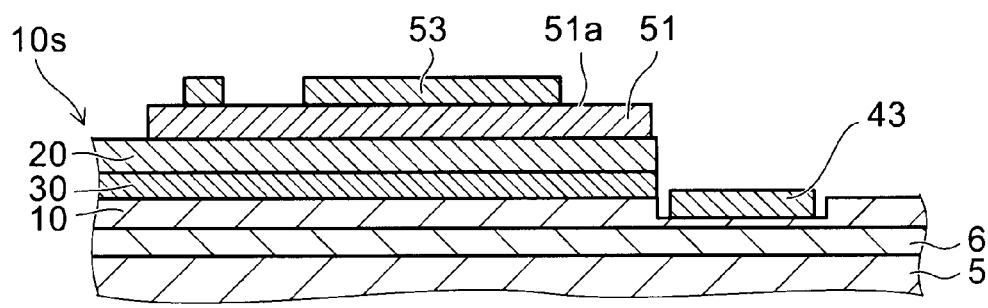
FIGS. 6A and 6B are sequential schematic cross-sectional views showing a manufacturing method of the semiconductor light emitting device according to the embodiment.
Figure 6B:
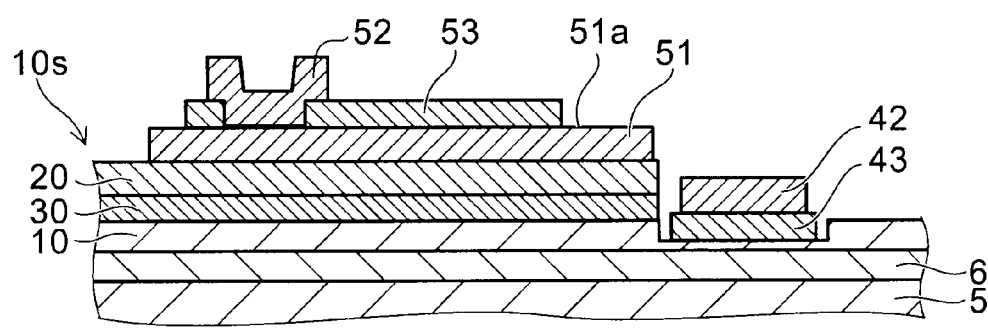

FIG. 6A and FIG. 6B are sequential schematic cross-sectional view illustrating a manufacturing method of a semiconductor light emitting device according to the first embodiment.

FIG. 6A corresponds with processes that follow the processes described in relation to FIG. 2A.

After forming the first conductive layer 51, as illustrated in FIG. 6A, the stacked structural body 10s is processed, the first semiconductor layer 10 is exposed, and the Al film is formed on the exposed first semiconductor layer 10 and on the first conductive layer 51. Then, the Al film is processed into a predetermined shape. The Al film becomes the third n-side conductive film 43 and the third conductive layer 53.

As illustrated in FIG. 6B, a Ni film is formed on the first conductive layer 51 and the third n-side conductive film 43 and processed into a predetermined shape. The Ni film becomes the second conductive layer 52 and the second n-side conductive film 42.

Furthermore, an Au film (not shown) is formed on the second conductive layer 52 and the second n-side conductive film 42. The Au film on the second n-side conductive film 42 becomes the first n-side conductive film 41.

Thus, the semiconductor light emitting device according to this embodiment is obtained.

In this configuration, the Al film of the second n-side conductive film 42 is provided in contact with the n-type GaN layer of the first semiconductor layer 10. As Al has ohmic characteristics with the n-type GaN layer, ohmic contact between the first semiconductor layer 10 and the first electrode 40 (specifically, the second n-side conductive film 42) can be ensured. In this case, the configuration of the semiconductor light emitting device can be further simplified. Specifically, the third conductive layer 53 and at least a portion of the first electrode 40 can be formed simultaneously and, therefore, productivity can be improved.

Thus, the semiconductor light emitting device according to this embodiment can further include, on the second major surface 10a side of the second semiconductor layer 20 side of the stacked structural body 10s, a first electrode 40 provided on the first semiconductor layer 10; and the first electrode 40 can include a layer that includes the material used for the third conductive layer 53. The first electrode 40 is in contact with the first semiconductor layer 10. For example, the third conductive layer 53 may include at least one of aluminum, silver, platinum, and rhodium; and the first electrode 40 may include a layer including the at least any one of the above described aluminum, silver, platinum, and rhodium.

Second Embodiment

The second embodiment is a manufacturing method of a semiconductor light emitting device.

Specifically, this manufacturing method is a method for manufacturing a semiconductor light emitting device having a stacked structural body 10s including a first semiconductor layer 10 of a first conductivity type that includes a nitride semiconductor, a second semiconductor layer 20 of a second conductivity type that includes a nitride semiconductor, and a light emitting layer 30 that includes a nitride semiconductor layer provided between the first semiconductor layer 10 and the second semiconductor layer 20, wherein the stacked structural body 10s has a portion of the first semiconductor layer 10 exposed to the second major surface 10a of the second semiconductor layer 20 side of the stacked structural body 10s; a first electrode 40 in contact with the first semiconductor layer 10 on the second major surface 10a side; and a second electrode 50 in contact with the second semiconductor layer 20 on the second major surface 10a side that includes a first conductive layer 51, a second conductive layer 52, and a third conductive layer 53. For example, the first conductive layer 51 is transparent with respect to luminescent light emitted from the light emitting layer 30. The second conductive layer 52 is in contact with the first major surface 51a. The third conductive layer 53 is in contact with the first major surface 51a and has the extending part 53p extending along the first major surface 51. At least a portion of the extending part 53p is not covered by the second conductive layer 52.

Figure 7:
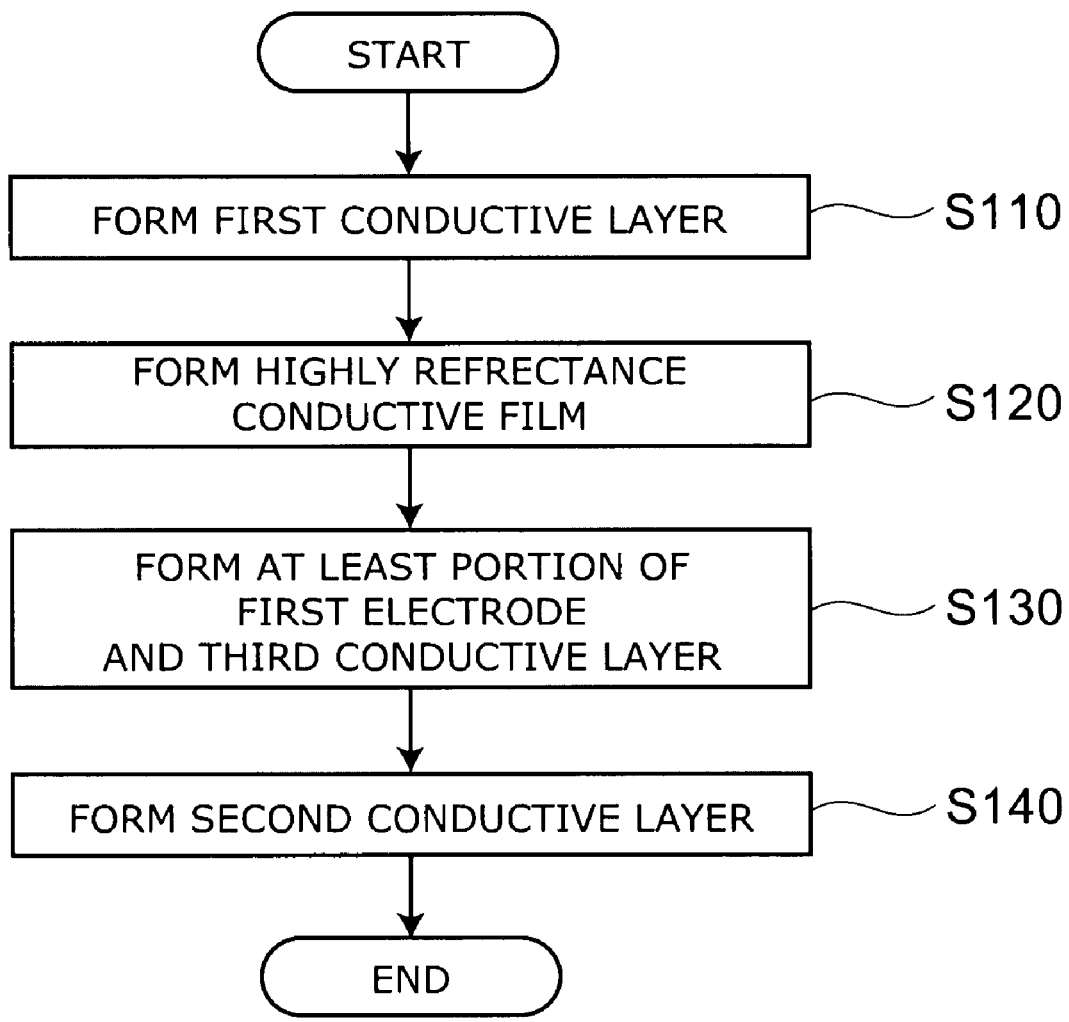
FIG. 7 is a flowchart showing a manufacturing method of a semiconductor light emitting device according to an embodiment.

FIG. 7 is a flowchart showing a manufacturing method of a semiconductor light emitting device according to the second embodiment.

As shown in FIG. 7, in this manufacturing method, the first conductive layer 51, that is transparent with respect to the luminescent light emitted from the light emitting layer 30, is formed on the second semiconductor layer 20 (step S110). For example, the process described in relation to FIG. 2A is performed.

A highly reflective conductive film, having higher reflectance with respect to the luminescent light than the second conductive layer 52, is formed on a portion of the first conductive layer 51 and on the exposed portion of the first semiconductor layer 10 (step S120). For example, the Al film described in relation to FIG. 6A may be formed as the highly reflective conductive film.

The highly reflective conductive film is processed, and at least a portion of the first electrode 40 (i.e., the third n-side conductive film 43) and the third conductive layer 53 having the extending part 53p extending along a first major surface 51a of the first conductive layer 51 on a side opposite the second semiconductor layer 20 are formed (step S130). For example, the process described in relation to FIG. 6A is performed.

The second conductive layer 52 exposing at least a portion of the extending part 53p of the third conductive layer 53 is formed on a portion of the first conductive layer 51 (step S140). For example, the process described in relation to FIG. 6B is performed.

According to the manufacturing method of the semiconductor light emitting device according to this embodiment, a semiconductor light emitting device having high bondability and high efficiency can be manufactured with high productivity.

The order of steps S110 through S140 described above may be reordered to the extent that is technically possible. Additionally, any two steps of steps S110 through S140 may be performed simultaneously to the extent that is technically possible. For example, the order of step S130 and step S140 may be reversed. Additionally, step S120 and step S130 can be performed simultaneously. For example, when using a mask to form the highly reflective conductive film, forming the highly reflective conductive film (step S120) and processing the highly reflective conductive film (step S130) are performed simultaneously.

The manufacturing method of nitride semiconductors according to this embodiment can be applied to from blue to green, from green to red Laser Diodes (LD) and the like as well as to from blue/green to green, from green to red LEDs.

According to these embodiments, a semiconductor light emitting device having high bondability and high efficiency, and a method for manufacturing the same can be provided.

Note that in this specification, the term, "nitride semiconductor" includes semiconductors of all compositions wherein composition proportions of x, y, and z in the formula $B_xIn_yAl_zGa_{1-x-y-z}N$ fall within the respective ranges of $0 \leq x \leq 1$, $0 \leq y \leq 1$, $0 \leq z \leq 1$, and $x+y+z \leq 1$. Furthermore, with the formula described above, "nitride semiconductors" shall also be understood to include semiconductors further containing group V elements other than N (nitrogen), semiconductors further containing various elements added to control various physical properties such as conductivity type and the like, and semiconductors further containing various elements that are included unintentionally.

In this specification, "perpendicular" and "parallel" are not used to mean perpendicular and parallel in their narrowest sense, but rather substantially perpendicular or parallel so as to take factors into account such as variations in manufacturing processes and the like.

Embodiments of the invention with reference to examples were described above. However, the invention is not limited to these examples. The scope of the invention includes all cases in which, for example, a person skilled in the art could make use of publicly known information to appropriately select configuration elements such as the substrate, buffer layer, semiconductor layer, light emitting layer, barrier layer, well layer, stacked structural body, conductive layers, electrodes, insulating film, and the like included in the semiconductor light emitting device provided that the obtained effects are similar. For example, the compositions, film thicknesses, and the like described in the embodiments described above are examples and various selections are possible.

Additionally, combinations of elements from two or more of the examples are also included in the scope of the invention, provided that they are technically possible and do not depart from the spirit of the invention.

Beside such cases, all semiconductor light emitting devices and methods for manufacturing the same based on the embodiments of the invention described above that are obtainable through appropriate design modifications by a person skilled in the art shall be understood to fall within the scope of the invention, provided such semiconductor light emitting devices and methods for manufacturing the same do not depart from the spirit of the invention.

Furthermore, regarding the scope of the spirit of the invention, it is understood that a variety of variations and modifications could be conceived by a person skilled in the art and that these variations and modifications all fall within the scope of the invention as well.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the invention.

What is claimed is:

1. A semiconductor light emitting device comprising: a stacked structural body including a first semiconductor layer of a first conductivity type including a nitride semiconductor, a second semiconductor layer of a second conductivity type including a nitride semiconductor, and a light emitting layer including a nitride semiconductor provided between the first semiconductor layer and the second semiconductor layer; a first conductive layer, the second semiconductor layer being disposed between the first conductive layer and the light emitting layer, the first conductive layer being transparent with respect to luminescent light emitted from the light emitting layer, the first conductive layer having a first major surface on a side opposite to the second semiconductor layer; a second conductive layer in contact with the first major surface and covering a portion of the first major surface; and a third conductive layer in contact with the first major surface and having a reflectance higher than a reflectance of the second conductive layer with respect to the luminescent light, the third conductive layer including an extending part extending in parallel to the first major surface, at least a portion of the extending part being not covered by the second conductive layer, wherein the second conductive layer covers an upper portion of the third conductive layer.

2. The device according to claim 1, further comprising a first electrode in contact with the first semiconductor layer on a side of a second major surface of a side of the second semiconductor layer of the stacked structural body,
a distance from the first electrode to a portion of the extending part being less than a distance from the second conductive layer to the first electrode.

3. The device according to claim 1, wherein a length of the extending part along an extending direction of the extending part is more than a width of the extending part along a direction perpendicular to the extending direction.

4. The device according to claim 1, wherein a width of the extending part in a direction perpendicular to an extending direction of the extending part and parallel to the first major surface is less than a width of the second conductive layer in a direction parallel to the first major surface.

5. The device according to claim 1, wherein a width of the extending part in a direction perpendicular to an extending direction of the extending part and parallel to the first major surface is less than a width of the second conductive layer in a direction perpendicular to the extending direction of the extending part and parallel to the first major surface.

6. The device according to claim 1, wherein
a width of the extending part in a direction perpendicular to an extending direction of the extending part and parallel to the first major surface is not less than 1 micrometer and not more than 50 micrometers, and
a width of the second conductive layer in a direction parallel to the first major surface is not less than 30 micrometers and not more than 80 micrometers.

7. The device according to claim 1, wherein
a width of the extending part in a direction perpendicular to an extending direction of the extending part and parallel to the first major surface is not less than 1 micrometer and not more than 50 micrometers, and
a width of the second conductive layer in a direction perpendicular to the extending direction of the extending part and parallel to the first major surface is not less than 30 micrometers and not more than 80 micrometers.

8. The device according to claim 1, wherein adhesion of the second conductive layer to the first conductive layer is greater than adhesion of the third conductive layer to the first conductive layer.

9. The device according to claim 1, wherein the second conductive layer includes a layer in contact with the first conductive layer, the layer including at least one of nickel, titanium, vanadium, platinum, and gold.

10. The device according to claim 1, wherein the third conductive layer includes at least one of aluminum, silver, platinum, and rhodium.

11. The device according to claim 1, wherein the first conductive layer includes an oxide containing at least one element selected from the group consisting of In, Sn, Zn, and Ti.

12. The device according to claim 1, wherein the second conductive layer is in contact with the third conductive layer.

13. The device according to claim 1, further comprising a insulating layer covering the stacked structural body.

14. The device according to claim 1, wherein a thickness of the first conductive layer is not less than 50 nanometers and not more than 300 nanometers.

15. The device according to claim 1, wherein
the first conductive layer includes an oxide containing at least one element selected from the group consisting of In, Sn, Zn, and Ti,
the second conductive layer includes Ni, and
the third conductive layer includes at least one of Al and Ag.

16. The device according to claim 1, wherein a number of the extending part is plural.

17. The device according to claim 1, further comprising a first electrode in contact with the first semiconductor layer on a side of a second major surface of a side of the second semiconductor layer of the stacked structural body,
the first electrode including a layer including a material used for the third conductive layer.

18. The device according to claim 17, wherein
the third conductive layer includes at least one of aluminum, silver, platinum, and rhodium; and
the layer includes the material used for the third conductive layer includes the at least one of aluminum, silver, platinum, and rhodium.

19. A method for manufacturing a semiconductor light emitting device, the device including: a stacked structural body including a first semiconductor layer of a first conductivity type including a nitride semiconductor, a second semiconductor layer of a second conductivity type including a nitride semiconductor, and a light emitting layer including a nitride semiconductor provided between the first semiconductor layer and the second semiconductor layer, the stacked structure body having a second major surface on a side of the second semiconductor layer, a portion of the first semiconductor layer being exposed on a side of the second major surface; a first electrode in contact with the first semiconductor layer on the side of the second major surface; and a second electrode in contact with the second semiconductor layer on the side of the second major surface, the second electrode including a first conductive layer having a first major surface opposite to the second semiconductor layer, the first conductive layer being transparent with respect to luminescent light emitted from the light emitting layer, a second conductive layer in contact with the first major surface, and a third conductive layer in contact with the first major surface and having an extending part extending along the first major surface, at least a portion of the extending part being not covered by the second conductive layer, the method comprising: forming the first conductive layer on the second semiconductor layer; forming a highly reflective conductive film on the exposed portion of the first semiconductor layer and on the first conductive layer, the highly reflective conductive film having a reflectance with respect to the luminescent light higher than a reflectance of the second conductive layer, and processing the highly reflective conductive film to form the third conductive layer and at least a portion of the first electrode; and forming the second conductive layer on a portion of the first conductive layer, wherein the second conductive layer covers an upper portion of the third conductive layer.

* * * * *